United States Patent [19]
Fisher

[11] Patent Number: 6,028,699
[45] Date of Patent: Feb. 22, 2000

[54] ELECTROMAGNETICALLY SHIELDED WINDOW, SENSOR SYSTEM USING THE WINDOW, AND METHOD OF MANUFACTURE

[75] Inventor: Donald S. Fisher, Valley Center, Calif.

[73] Assignee: Exotic Electrooptics, Murrieta, Calif.

[21] Appl. No.: 08/782,615

[22] Filed: Jan. 13, 1997

[51] Int. Cl.$^7$ .............................. G02B 1/00; G02B 5/22
[52] U.S. Cl. ............................................................. 359/360
[58] Field of Search ................................... 359/360, 359, 359/350, 894

[56] References Cited

U.S. PATENT DOCUMENTS 4,770,479  9/1988  Tustison .
5,173,443  12/1992  Biricik et al. .
5,194,985  3/1993  Hilton, Sr. .

*Primary Examiner*—Jon Henry
*Attorney, Agent, or Firm*—Gregory Garmong

[57] ABSTRACT

A window is transparent to infrared and/or visible radiation, and is shielded against electromagnetic radiation. The window includes a substrate made of a material transparent to the selected wavelength band of radiation, and a multilayer grid pattern overlying the substrate. The grid pattern comprises a first layer of an electrically conductive material adjacent to the substrate, and a second layer of a magnetically permeable material overlying the first layer. Preferably, there is a third layer of an electrically conductive material overlying the second layer.

41 Claims, 7 Drawing Sheets

ELECTROMAGNETICALLY SHIELDED WINDOW, SENSOR SYSTEM USING THE WINDOW, AND METHOD OF MANUFACTURE

BACKGROUND OF THE INVENTION

This invention relates to windows and, in particular, to a window that is transparent to visible and/or infrared radiation but is opaque to electromagnetic radiation.

Sensors operating in the visible or infrared wavelength bands are widely used in civilian and military applications. Such sensors are usually rather fragile in construction and susceptible to externally induced damage. They are therefore often placed behind a protective window that is transparent to the radiation being sensed but resists damage from hostile physical and chemical environmental effects, impacts, and the like.

Such a mechanically protective window is sufficient for some applications, but in other cases, such as many military applications, the window must also protect against penetration of radio frequency energy to the sensor. Various techniques are known for attenuating incident radio frequency energy while allowing the transmission of the visible or infrared radiation of interest. These techniques operate by a variety of reflection and absorption mechanisms. For example, it is known to place a metallic grid pattern formed of narrow, electrically conductive metallic stripes onto the surface of the window, which grid pattern reflects the incident radio frequency energy away from the window while passing most of the visible or infrared radiation.

While operable, such metallic grid patterns still permit the passage of some of the incident radio frequency energy through the window. The inventor has recognized a need for an improved approach wherein an even smaller amount of the incident radio frequency energy passes through the window, while still permitting the passage of the visible or infrared radiation of interest. The present invention fulfills this need, and further provides related advantages.

SUMMARY OF THE INVENTION

The present invention provides a window that transmits visible and/or infrared energy while excluding incident radio frequency energy in selected wavebands from about 10 KHz (kilohertz) to about 100 GHz (gigahertz), a sensor system using the window, and a method for their manufacture. The window has excellent transmission of the desired visible and/or infrared energy, while excluding nearly all of the undesirable incident radio frequency energy. The window is fabricated using microelectronic techniques known for use in other applications.

In accordance with the invention, a window comprises a substrate made of a material transparent to a selected wavelength band of radiation, typically visible or infrared, and a multilayer grid pattern formed of an array of stripes overlying the substrate. The stripes comprise a first layer of an electrically conductive material adjacent to and contacting the substrate, and a second layer of a material having high magnetic permeability overlying and contacting the first layer. The first layer, rather than the second layer, is desirably in contact with the substrate. Preferably, there is a third layer of an electrically conductive material adjacent to the second layer, so that the stripe has a total of three layers arranged as two electrically conducting layers with a layer made of material having magnetic permeability therebetween. Additional pairs of layers of electrically conductive material and material having high magnetic permeability may be added to produce a five-layer stripe, a seven-layer stripe, etc. The grid may have any of a wide variety of operable geometries, including a rectangular grid, a square grid, concentric circles, a random pattern, etc., as may be useful for particular circumstances. The stripe is grounded, preferably with a conductor extending to and contacting the first layer.

The stripes are thin, with each layer preferably being from about 500 to about 5000 nanometers thick. The window may be prepared by furnishing a substrate of a material transparent to the selected wavelength band of radiation, and depositing the multilayer grid pattern overlying the substrate. The deposition may be accomplished by coating a surface of the substrate with a photoresist material, patterning the photoresist material with a plurality of openings therethrough which define the grid, and depositing the multilayer grid pattern onto the substrate through the openings in the photoresist material. The grid may be present on one or both surfaces of the window, and also may be embedded within the interior of the window.

The window is typically used in a sensor system, between a sensor and the scene being viewed, to protect the sensor.

The present approach provides a window that is durable and protective, both against physical and chemical environmental influences, and also against external radio frequency energy. The window excludes a substantially higher amount of incident radiation that existing windows having only metallic electrically conductive grids or continuous reflective layers. The protection afforded by the window of the invention is better for all angles of incidence of the radio frequency energy, as compared with prior windows.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 3 presents schematic sectional views of embodiments of the window of FIG. 2, taken along lines 3—3, wherein

DETAILED DESCRIPTION OF THE INVENTION

Figure 1:
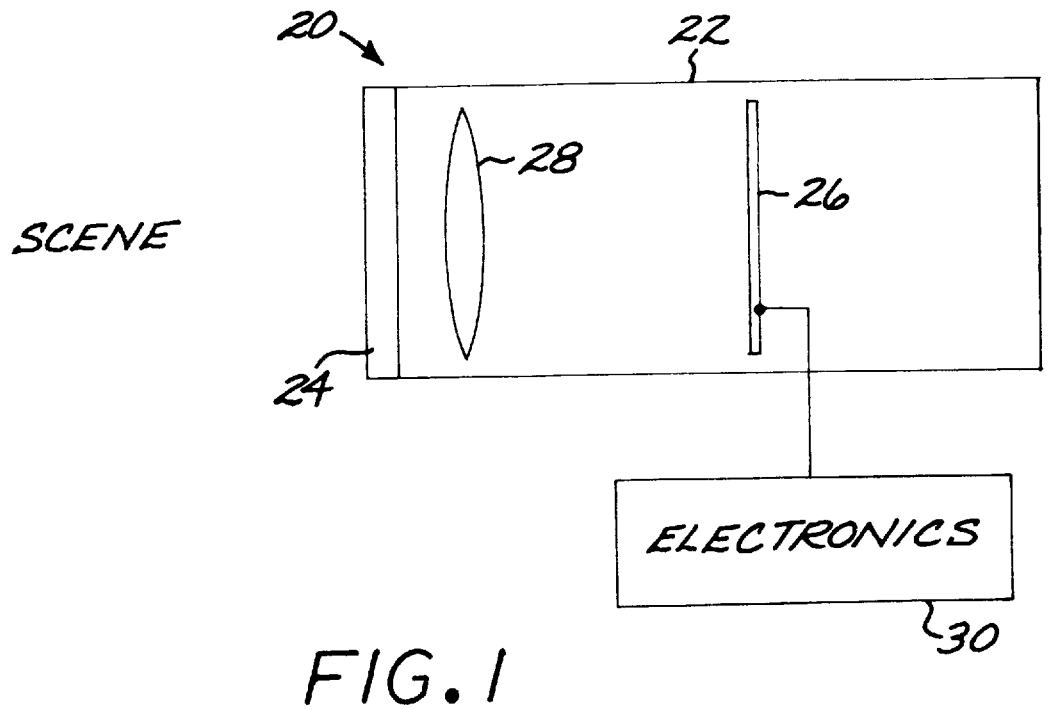
FIG. 1 is a schematic view of a sensor system.

FIG. 1 depicts an optical system 20 having a housing 22 and a window 24 through the housing 22. The window is illustrated as flat, but it may be curved in the manner of a dome in all of the configurations discussed herein. Inside the housing 22 is a sensor 26 such as a focal plane array and appropriate optics 28, here represented diagrammatically by a single lens. Light from a scene external to the housing 22 passes through the window 24 and is focused by the optics 28 onto the sensor 26. The sensor 26 produces an electrical output responsive to the incident light, which electrical output is provided to processing electronics 30. The housing 22, sensor 26, optics 28, and electronics 30 are known in the art.

Figure 2:
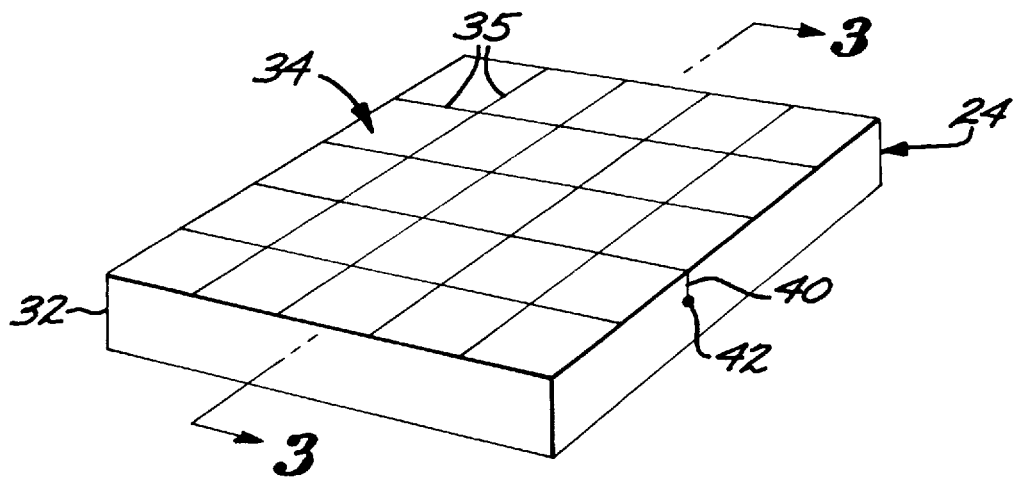
FIG. 2 is a perspective view of a window according to the invention as used in the sensor system of FIG. 1.

FIG. 2 is a perspective view of the window 24 according to the invention. The window 24 includes a substrate 32 made of a material that is transparent to a selected wavelength band of radiation, typically in either the visible or the infrared ranges. A multilayer grid 34 overlies the substrate 32. The grid 34 is formed of a plurality of stripes 35 arranged in an array.

FIGS. 3A–3E illustrate five embodiments of the window which are within the scope of the invention and which could be domed as well as flat. (The incident radiation is assumed to be incident upon the upper side of the window 34 in each case.) In each case, the grid 34 has at least two layers, a first layer 36 of an electrically conductive material adjacent to and contacting the substrate 32 and a second layer 38 of a material having high magnetic permeability overlying the first layer 36. (Alternatively, but less preferably, the second layer 38 of the material having high magnetic permeability may lie adjacent to and contacting the substrate 32, and the first layer 36 may overlie the second layer 38.) A grounding bus bar 40 made of an electrically conductive material is disposed laterally adjacent to and in electrical communication with the first layer 36 and extends to a location on the periphery of substrate 32 to which an electrical ground connection 42 is made (see FIG. 2).

The substrate 32 is selected to be transparent to the selected wavelength band of radiation of interest. For the viewing of radiation in the visible wavelength range, the substrate 32 is preferably fused silica, quartz, borosilicate glass, or germanate glass. For the viewing of radiation in the infrared wavelength range, the substrate 32 is preferably diamond, germanium, silicon, gallium arsenide, zinc selenide, zinc sulfide, aluminum oxynitride, spinel, sapphire, calcium aluminide, or magnesium fluoride. The electrically conductive material of the first layer 36 typically has an electrical resistivity of about $1-3 \times 10^{-6}$ ohm-cm and a relative permeability of 1. Preferred electrically conductive materials include copper, aluminum, gold, silver, platinum, or palladium. The material having high magnetic permeability of the second layer 38 typically has an electrical resistivity of about $25-75 \times 10^{-6}$ ohm-cm and a relative permeability of from about 1000 to about 100,000. The material having high magnetic permeability is based upon 3-d metals, specifically cobalt, iron, or nickel, and is ferromagnetic. Some preferred metals having high magnetic permeability include the permalloys, mu-metal, or supermalloy. Examples of operable compositions include, in weight percent, supermalloy, having a composition of 79–80 percent nickel, 14–15 percent iron, 5 percent molybdenum, balance trace elements totalling 100 percent; mu-metal, having a composition of 76 percent nickel, 16–20 percent iron, 4–5 percent copper, 1–2 percent chromium, balance trace elements totalling 100 percent; permalloy (Cr-Mo), having a composition of 80.5 percent nickel, 15.1 percent iron, 2.6 percent molybdenum, 1.8 percent chromium, balance trace elements totalling 100 percent; permalloy (V), having a composition of 82.3 percent nickel, 13.3 percent iron, 3.9 percent vanadium, balance trace elements totalling 100 percent; permalloy (Cr), having a composition of 81.4 percent nickel, 15.0 percent iron, 3.6 percent chromium, balance trace elements totalling 100 percent; and permalloy (Cu), having a composition of 69.5 percent nickel, 13.9 percent iron, 15.9 percent copper, balance trace elements totalling 100 percent.

The geometry of the grid 34 and the thickness, linewidth, and spacing of the stripes 35, depends upon the specific application. The grid 34 is illustrated in FIG. 2 as being rectangular and regular, but it may be of any other operable geometry as well. Other operable geometries include, for example, rectangular but irregular spacings, regular or irregular concentric circles, regular or irregular hexagons, square, or random. A typical value of the linewidth W of each stripe 35 is from about 5 micrometers to about 20 micrometers, and a typical value of the spacing S of each stripe 35 from the adjacent stripe is from about 100 micrometers to about 500 micrometers. Each of the layers 36 and 38 is typically from about 500 nanometers to about 5000 nanometers in thickness.

Figure 3A:
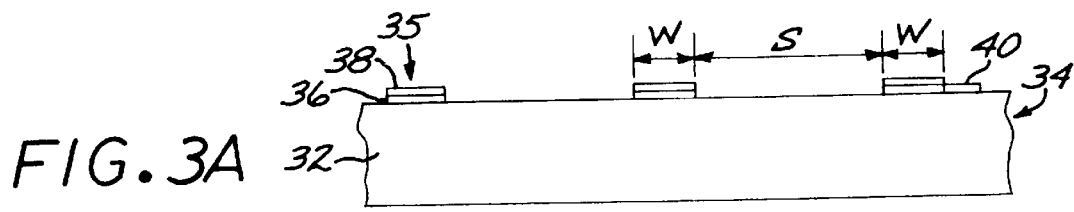
FIG. 3A illustrates a two-layer stripe.

In the embodiment of FIG. 3A, the stripes 35 are present on only one side of the substrate 32, the outwardly facing side.

Figure 3B:
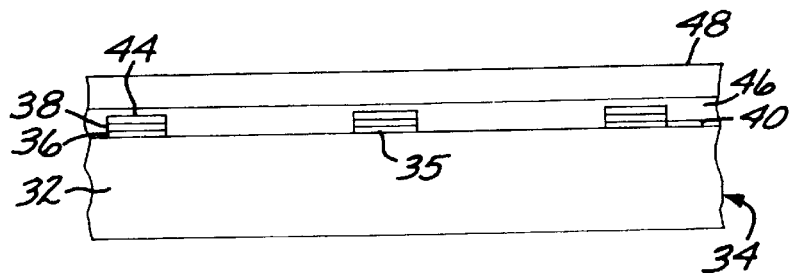
FIG. 3B illustrates a three-layer stripe with an antireflection coating and a diamond-like carbon coating.

In the embodiment of FIG. 3B, a third layer 44 of an electrically conductive material overlies and is in contract with the second layer 38. The third layer 44 is preferably made of the same material as the first layer 36, and is from about 500 to about 5000 nanometers thick. Additionally, the embodiment of FIG. 3B includes an antireflective coating 46 overlying the substrate 32 and the stripes 35, and a protective coating 48 overlying the antireflective coating 46. The nature of the antireflective coating 46 depends upon the nature of the radiation to be detected by the sensor 26 and is known in the art for each wavelength range of interest. The protective coating 48 is preferably diamond-like carbon (DLC) about 0.5 to about 5.0 micrometers thick.

FIG. 3B illustrates a three-layer structure with the electrically conductive first layer adjacent to the substrate, the magnetically permeable second layer overlying the first layer, and the electrically conductive third layer overlying the second layer. This arrangement is preferred for a three-layer stripe, because the third layer 44 rejects incident electromagnetic energy by reflection, the second layer 38 absorbs any electromagnetic energy that passes through the third layer 44, and the first layer 36 adjacent to the substrate provides electrical grounding contact to the bus bar 40. Less preferably, the three-layer stripe could be of a structure having a layer of a material of high permeability, a layer that is electrically conductive, and a layer of a material of high magnetic permeability.

Figure 3C:
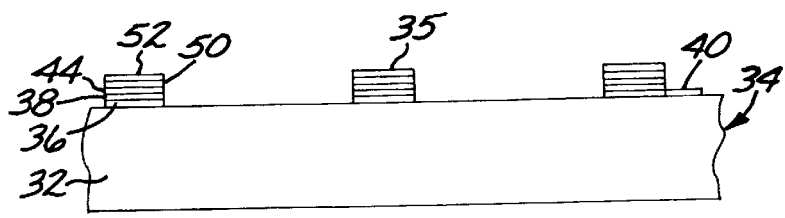
FIG. 3C illustrates a five-layer stripe.

The embodiment of FIG. 3C has two additional layers in each stripe 35, as compared with the embodiment of FIG. 3B. A fourth layer 50 of material having high magnetic permeability overlies the third layer 44, and a fifth layer 52 of electrically conductive material overlies the fourth layer 50. The fourth layer 50 and the fifth layer 52 are preferably of the same material and dimensions as the second layer 38 and the first layer 36, respectively. In other embodiments, additional pairs of layers of material having high magnetic permeability and electrically conductive material may be present overlying the stripe, such that the uppermost layer and the lowermost layer are the electrically conductive material.

Figure 3D:
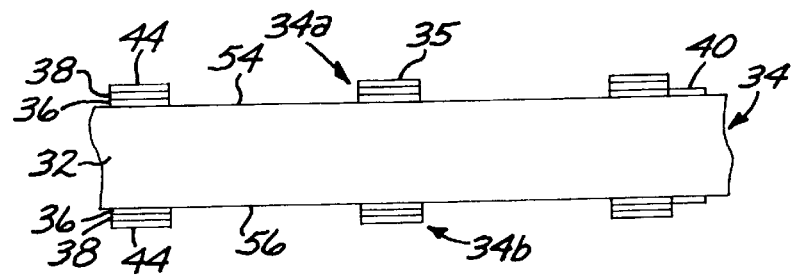
FIG. 3D illustrates three-layer stripes on both faces of the window.

The embodiment of FIG. 3D has three-layer stripes as in FIG. 3B, but there is a grid 34a on an outwardly facing surface 54 of the substrate 32 and another grid 34b on an inwardly facing surface 56 of the substrate 32.

Figure 3E:
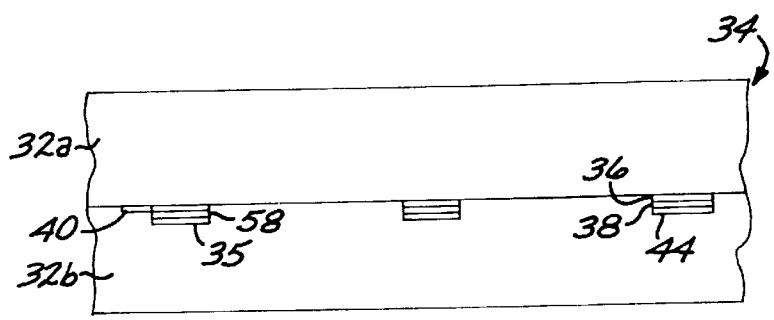
FIG. 3E illustrates a three-layer embedded stripe.

The embodiment of FIG. 3E illustrates a three-layer "buried" grid 35 positioned within the substrate 32. The buried grid 35 is typically prepared by providing two substrate halves 32a and 32b, forming a pattern of grooves 58 in the surface of one of the halves, in this case the substrate half 32b, depositing the grid 35 into the grooves in the manner to be described subsequently, and attaching the other of the substrate halves, in this case the substrate half 32a, overlying the substrate half 32b. Such a buried grid is within the scope of the invention.

The various features of FIGS. 3A–3E may be used together and interchangeably, as long as they are not incompatible. For example, the embodiment of FIG. 3B is a currently most-preferred embodiment of the invention. The embodiments of FIGS. 3A and 3C–3E are shown without the antireflective coating 46 and the protective coating 48 for clarity, but the coatings 46 and 48 would preferably be present on these windows as well in practical applications.

The use of three or more layers, as in the embodiments of FIGS. 3B–3E, is preferred over the use of two layers, as in the embodiment of FIG. 3A, for a preselected total thickness of the electrically conductive material and the material having high magnetic permeability. The alternating layering tends to mix the properties of the layers and allow the layers to be quite thin yet effective, a desirable result.

Figure 4:
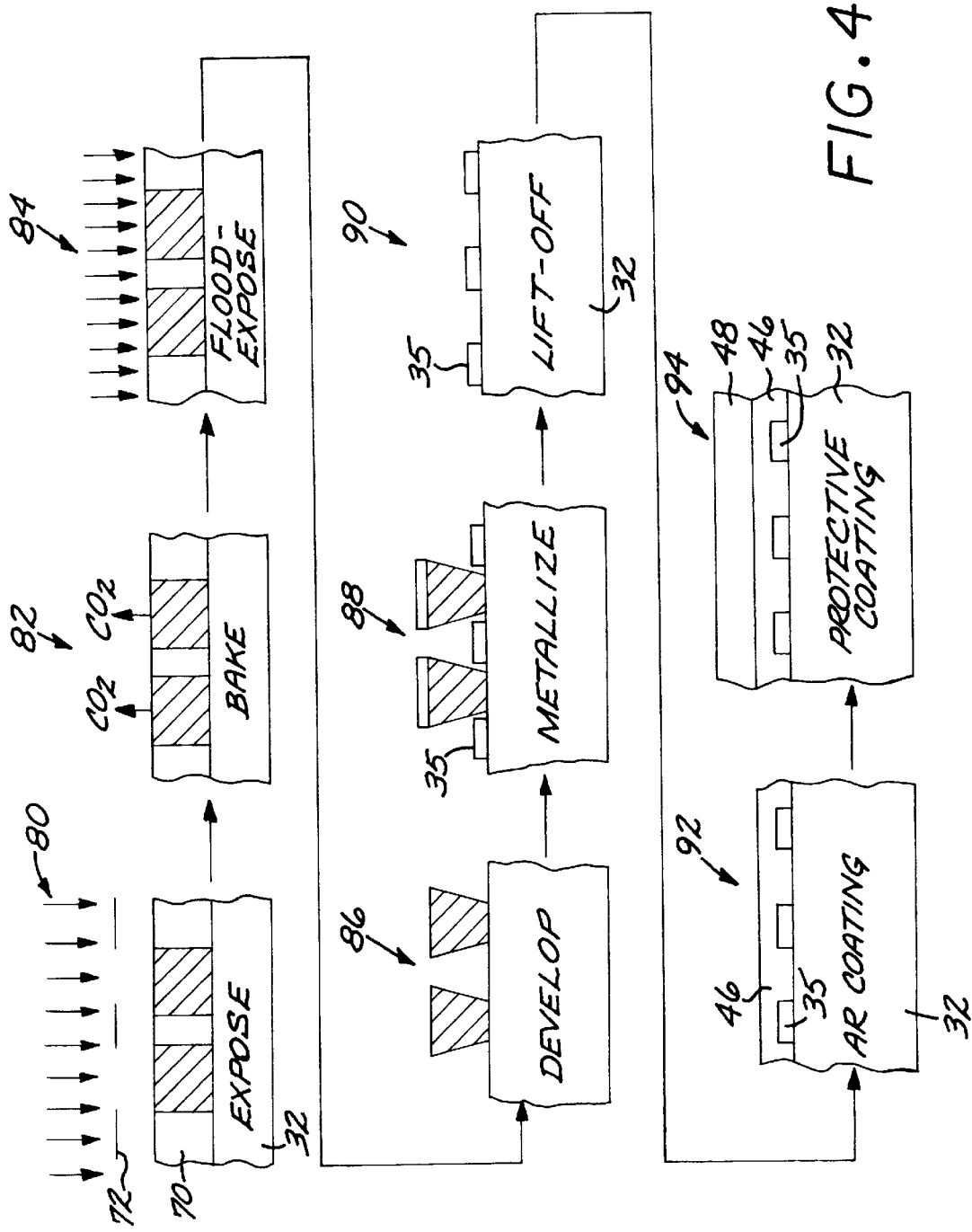
FIG. 4 is a diagrammatic flow diagram of a method for preparing the windows of FIGS. 3.

FIG. 4 illustrates a preferred lift-off approach for preparing a window according to the invention. The substrate 32 is coated with a layer 70 of a photoresist material. A mask 72 which defines the geometry of the grid 34 is placed over the photoresist layer 70 and exposed, numeral 80. The photoresist material is baked, numeral 82, and exposed with UV radiation, numeral 84. The unexposed photoresist material is washed away with a solvent (i.e., developed), numeral 86.

The stripes 35 are deposited, numeral 88, a process sometimes termed metallizing. In FIG. 4, the details of the stripes 35 are not shown, but they generally are of the multilayered structures such as described in relation to FIGS. 3A–E. The electrically conductive metallic layer(s) and the layer(s) made of material of high magnetic permeability are deposited by any appropriate technique, with vacuum electron beam physical vapor deposition being preferred for the pure electrically conductive metals and sputtering preferred for the alloys having high magnetic permeability. The deposition of the multiple layers may be accomplished in a single vacuum chamber or in separate chambers.

The remaining photoresist is removed by a solvent lift-off process, numeral 90, leaving the basic structure. As described in relation to FIG. 3B, the antireflective coating 46 may be deposited overlying the stripes 35 and the substrate 32, numeral 92; further the protective layer 48 may be deposited overlying the antireflective coating 46 (or directly over the stripes and the substrate, if no antireflective coating is used), numeral 94. The steps 92 and 94 are accomplished by any operable deposition technology, such as ion beam deposition, sputtering, chemical vapor deposition, plasma arc deposition, plasma-assisted chemical vapor deposition, or microwave-plasma-assisted chemical vapor deposition.

The present invention has been practiced in the following manner to produce a window substantially as shown in FIGS. 2 and 3B. A substrate of 1 centimeter thick zinc selenide or zinc sulfide was furnished, for an infrared-transparent window. A three-layer rectangular grid was deposited by the method of FIG. 4. The first layer and the third layer were each copper from about 500 to about 5000 nanometers thick, and the second layer was permalloy from about 500 to about 5000 nanometers thick. The linewidths W were from about 5 to about 15 micrometers, and the spacings S were from about 150 to about 750 micrometers. The antireflection coating for the infrared-transparent window was underlayers of carbide or nitride, such as silicon nitride or germanium carbide, and the protective coating was diamond-like carbon, both deposited by plasma-assisted chemical vapor deposition. Alternatively, the antireflection coating may be alternating layers of germanium, zinc sulfide, and thorium fluoride, deposited by thermal evaporation, electron-beam evaporation, or ion beam deposition.

Figure 5:
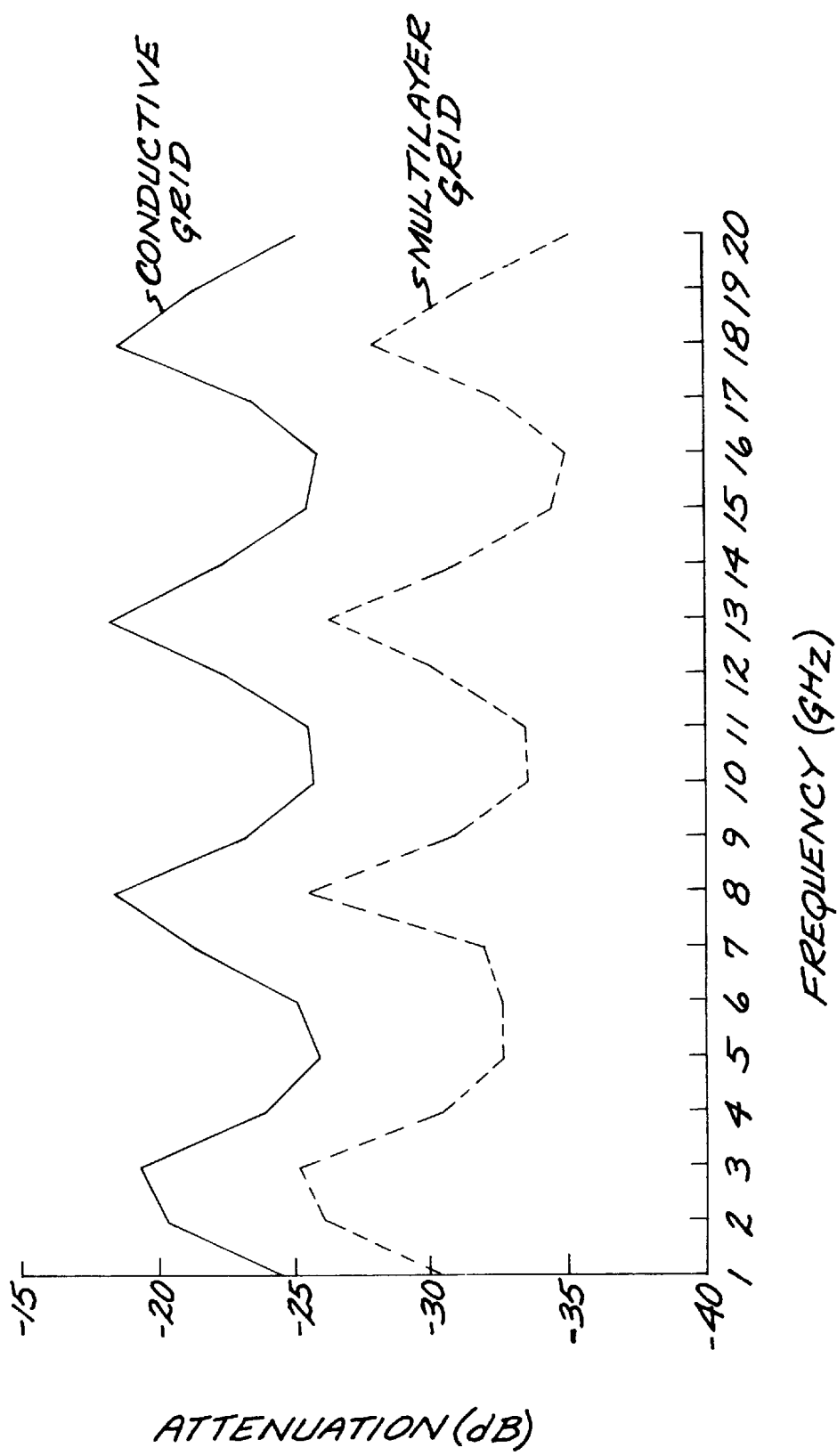
FIG. 5 is a graph of attenuation in transmission as a function of frequency of incident energy, for a window with a grid having only electrically conductive stripes and for a window with a grid according to the invention.
Figure 6:
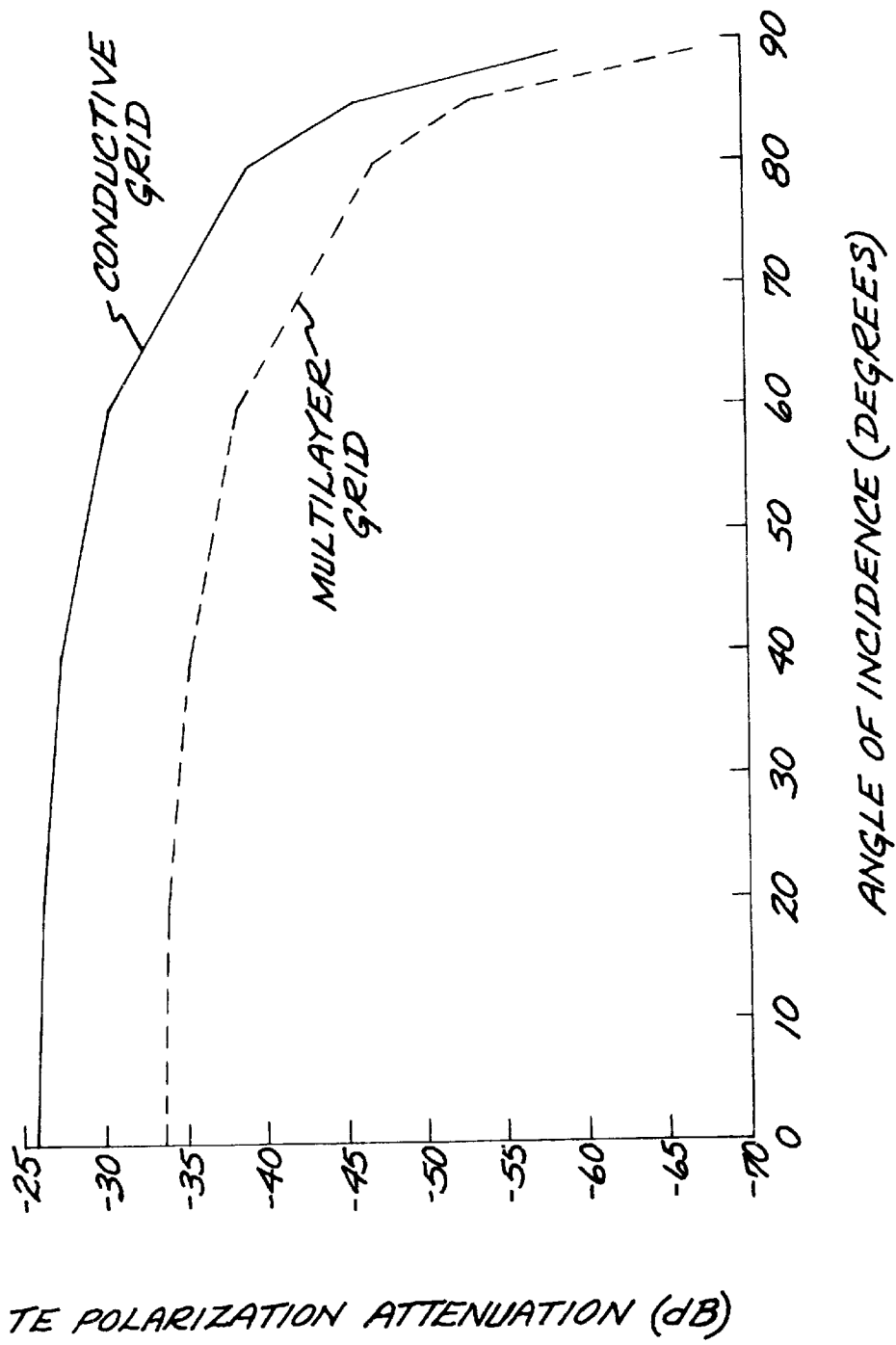
FIG. 6 is a graph of TE polarization attenuation as a function of angle of incidence, for a window with a grid having only electrically conductive stripes and for a window with a grid according to the invention.
Figure 7:
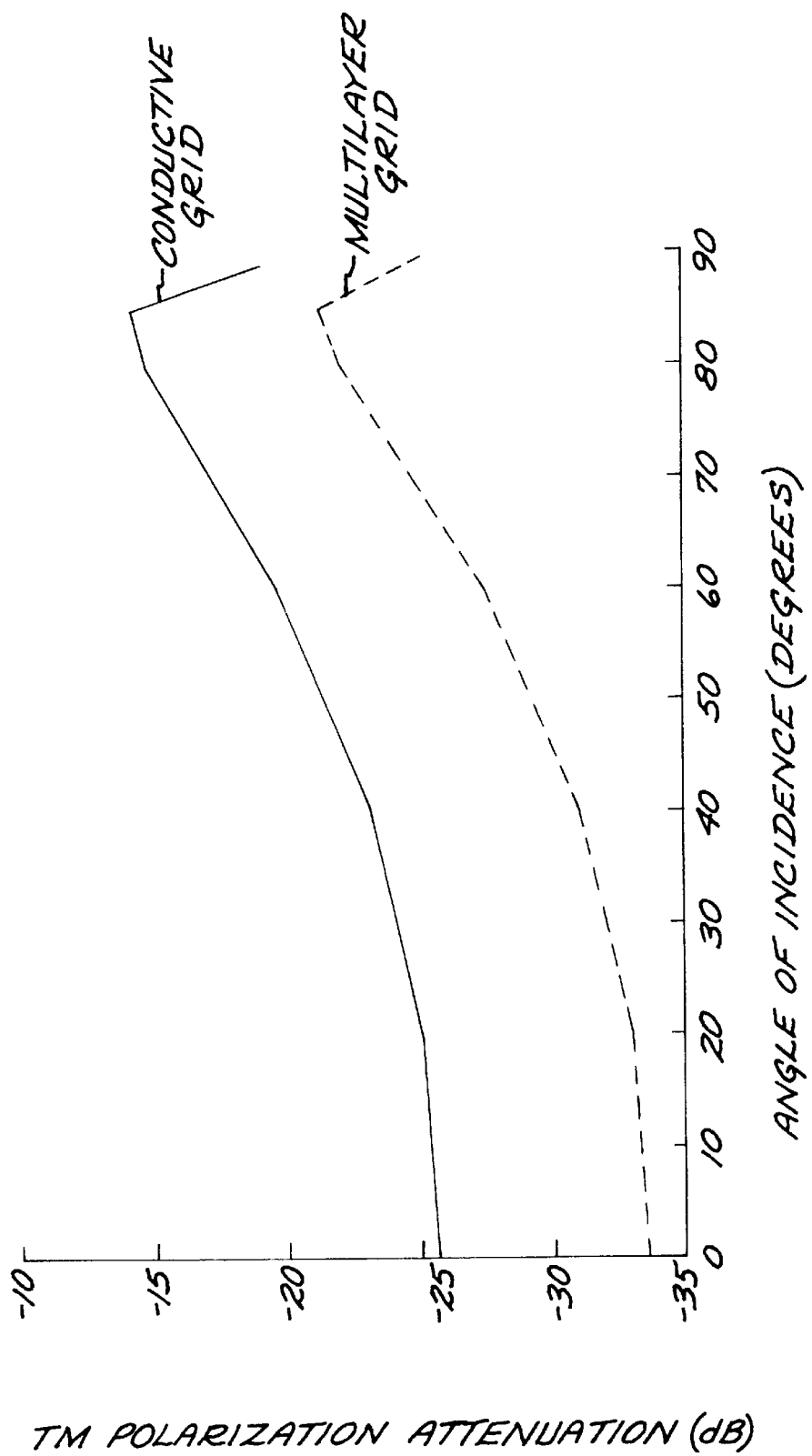
FIG. 7 is a graph of TM polarization attenuation as a function of angle of incidence, for a window with a grid having only electrically conductive stripes and for a window with a grid according to the invention.
Figure 8:
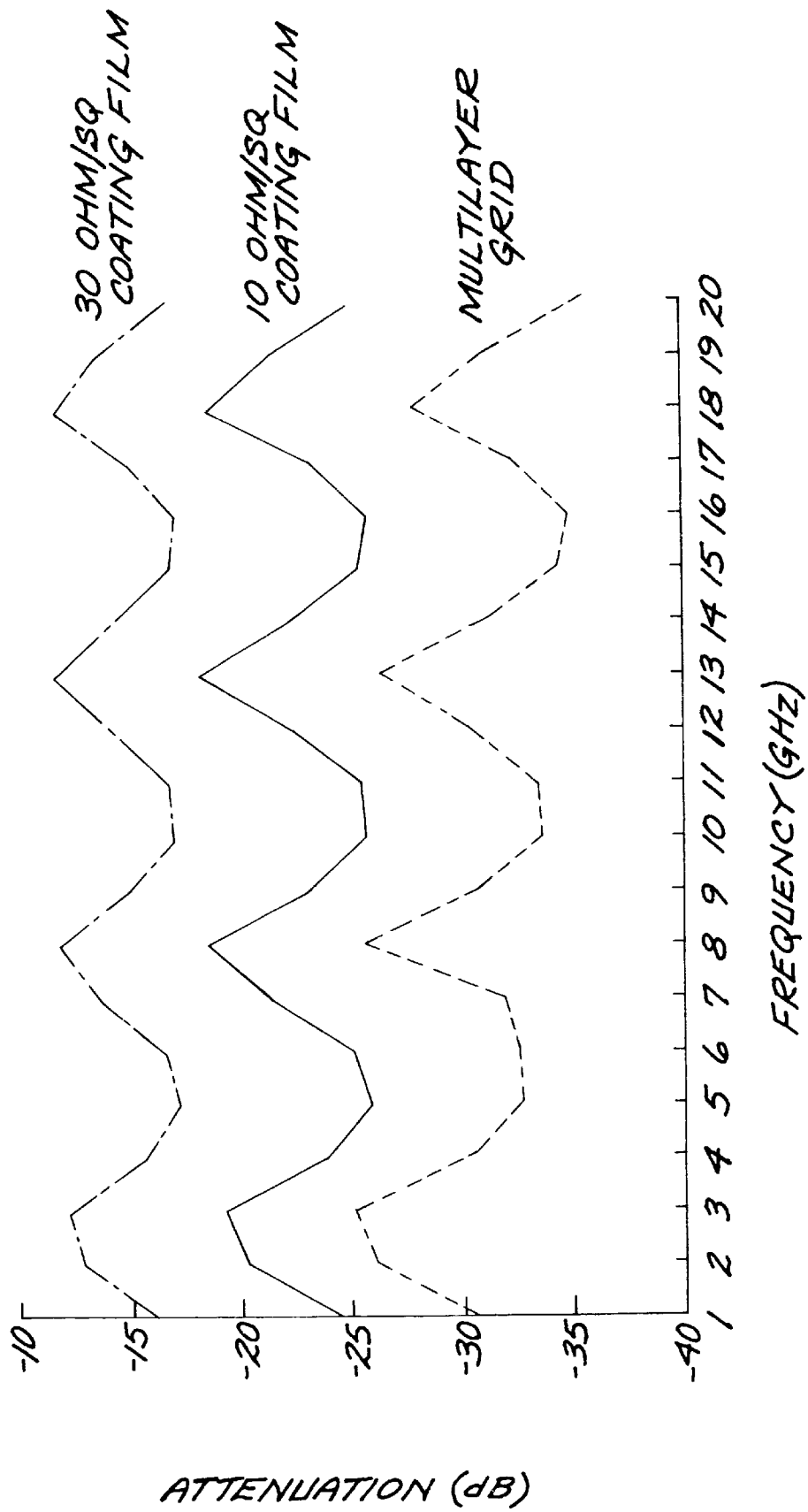
FIG. 8 is a graph of attenuation as a function of frequency of incident radiation, for a window with a grid according to the invention, for a window having a continuous doped semiconductor layer overlying the substrate, and for a window having a continuous conductive oxide layer overlying the substrate.

FIGS. 5–8 present the results of comparative testing of the infrared-transparent window of the invention with a window that is otherwise similar but has only a single-layer grid of electrically conductive metal. The grid in this case was rectangular with dimensions of 15 by 250 micrometers and prepared as described in the example above. As shown in FIG. 5, the multilayer grid of the invention achieves from about −5 dB to about −10 dB improvement in shielding over the single-layer grid, over the entire radio frequency range of interest of 1–20 GHz. FIGS. 6–7 show that the improvement is achieved over the entire range of angle of incidence of the radio frequency energy from 0 to 90 degrees, for a representative frequency of 10 GHz, and for both the TE (FIG. 6) and TM (FIG. 7) components of the radio frequency energy. FIG. 8 compares the performance of the multilayer grid of the invention with continuous films of two types, a continuous layer of indium-tin oxide (ITO) having a resistivity of 10 ohms per square and a semiconductor layer having a resistivity of 30 ohms per square, in each case deposited on a 1-centimeter thick zinc sulfide substrate. The improvements achieved with the present approach over the continuous films are comparable with those achieved with the present approach over the single-layer grid structure.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A window, comprising:
 a substrate made of a material transparent to a selected wavelength band of radiation; and
 a multilayer grid pattern formed of an array of stripes overlying and contacting the substrate, the stripes comprising:
  a first layer of an electrically conductive material, and
  a second layer of a second-layer material contacting the first layer, the second-layer material having a relative magnetic permeability equal to or exceeding about 1000.

2. The window of claim 1, wherein the first layer is adjacent to the substrate.

3. The window of claim 2, wherein the stripes further include a third layer of an electrically conductive material overlying and adjacent to the second layer.

4. The window of claim 3, wherein the stripes further include
   a fourth layer of a fourth-layer material overlying and adjacent to the third layer, the fourth-layer material having a relative magnetic permeability equal to or exceeding about 1000.

5. The window of claim 4, wherein the stripes further include
   a fifth layer of an electrically conductive material overlying and adjacent to the fourth layer.

6. The window of claim 1, wherein the second layer is adjacent to the substrate.

7. The window of claim 1, further including
   an antireflective coating overlying the substrate.

8. The window of claim 1, further including
   a coating of diamond-like carbon overlying the substrate.

9. The window of claim 1, wherein the substrate is made of a material transparent to visible light.

10. The window of claim 1, wherein the substrate is made of a material selected from the group consisting of fused silica, quartz, borosilicate glass, and germanate glass.

11. The window of claim 1, wherein the substrate is made of a material transparent to infrared light.

12. The window of claim 1, wherein the substrate is made of a material selected from the group consisting of diamond, germanium, silicon, gallium arsenide, zinc selenide, zinc sulfide, aluminum oxynitride, spinel, sapphire, calcium aluminide, and magnesium fluoride.

13. The window of claim 1, wherein the first layer is made of a material selected from the group consisting of copper, aluminum, gold, silver, platinum, and palladium.

14. The window of claim 1, wherein the second layer is made of a material selected from the group consisting of permalloy, supermalloy, and mu-metal.

15. The window of claim 1, wherein the first layer is from about 500 to about 5000 nanometers thick.

16. The window of claim 1, wherein the second layer is from about 500 to about 5000 nanometers thick.

17. The window of claim 1, further including:
   an electrical ground conductor in electrical communication with the first layer.

18. A window, comprising:
   a substrate made of a material transparent to a selected wavelength band of radiation, the selected wavelength band being selected from the group consisting of the visible and the infrared;
   a multilayer grid pattern overlying the substrate, the grid pattern comprising:
      a first layer of an electrically conductive material overlying and contacting the substrate,
      a second layer of a second-layer material overlying and contacting the first layer, the second-layer material having a relative magnetic permeability equal to or exceeding about 1000, and
      a third layer of an electrically conductive material overlying and contacting the second layer; and
   an electrical ground conductor in electrical communication with the first layer.

19. The window of claim 18, wherein the substrate is made of a material selected from the group consisting of diamond, germanium, silicon, gallium arsenide, zinc selenide, zinc sulfide, aluminum oxynitride, spinel, sapphire, calcium aluminide, and magnesium fluoride.

20. A sensor system operable to view a scene, comprising
   a sensor; and
   a window between the sensor and the scene, the window comprising
      a substrate made of a material transparent to a selected wavelength band of radiation,
      a multilayer grid pattern formed of an array of stripes overlying and contacting the substrate, each of the stripes comprising:
         a first layer of an electrically conductive material, and
         a second layer of a second-layer material contacting the first layer, the second-layer material having a relative magnetic permeability equal to or exceeding about 1000.

21. The sensor system of claim 20, wherein the second-layer material has a relative magnetic permeability of from about 1000 to about 100,000.

22. The sensor system of claim 20, wherein the first layer is adjacent to the substrate.

23. The sensor system of claim 22, wherein the stripes further include
   a third layer of an electrically conductive material overlying and adjacent to the second layer.

24. The sensor system of claim 23, wherein the stripes further include
   a fourth layer of a fourth-layer material overlying and adjacent to the third layer, the fourth-layer material having a relative magnetic permeability equal to or exceeding about 1000.

25. The sensor system of claim 24, wherein the stripes further include
   a fifth layer of an electrically conductive material overlying and adjacent to the fourth layer.

26. The sensor system of claim 20, wherein the second layer is adjacent to the substrate.

27. The sensor system of claim 20, further including
   an antireflective coating overlying the substrate.

28. The sensor system of claim 20, further including
   a coating of diamond-like carbon overlying the substrate.

29. The sensor system of claim 20, wherein the substrate is made of a material transparent to visible light.

30. The sensor system of claim 20, wherein the substrate is made of a material selected from the group consisting of fused silica, quartz, borosilicate glass, and germanate glass.

31. The sensor system of claim 20, wherein the substrate is made of a material transparent to infrared light.

32. The sensor system of claim 20, wherein the substrate is made of a material selected from the group consisting of diamond, germanium, silicon, gallium arsenide, zinc selenide, zinc sulfide, aluminum oxynitride, spinel, sapphire, calcium aluminide, and magnesium fluoride.

33. The sensor system of claim 20, wherein the first layer is made of a material selected from the group consisting of copper, aluminum, gold, silver, platinum, and palladium.

34. The sensor system of claim 20, wherein the second layer is made of a material selected from the group consisting of permalloy, supermalloy, and mu-metal.

35. The sensor system of claim 20, wherein the first layer is from about 500 to about 5000 nanometers thick.

36. The sensor system of claim 20, wherein the second layer is from about 500 to about 5000 nanometers thick.

37. The sensor system of claim 20, further including:

an electrical ground conductor in electrical communication with the first layer.

38. The window of claim 1, wherein the second-layer material has a relative magnetic permeability of from about 1000 to about 100,000.

39. The window of claim 18, wherein the second-layer material has a relative magnetic permeability of from about 1000 to about 100,000.

40. A window, comprising:

a substrate made of a material transparent to a selected wavelength band of radiation; and a multilayer grid pattern formed of an array of stripes overlying and contacting the substrate, the stripes comprising:

a first layer of an electrically conductive material, and a second layer of a second-layer material contacting the first layer, the second-layer material being a ferromagnetic alloy of a metal selected from the group consisting of iron, nickel, and cobalt.

41. The window of claim 40, wherein the second-layer material has a relative magnetic permeability of from about 1000 to about 100,000.

* * * * *